US 6,552,944 B2

(12) United States Patent
Fifield et al.

(10) Patent No.: US 6,552,944 B2
(45) Date of Patent: Apr. 22, 2003

(54) SINGLE BITLINE DIRECT SENSING ARCHITECTURE FOR HIGH SPEED MEMORY DEVICE (75) Inventors: John A. Fifield, Underhill, VT (US); Toshiaki Kirihata, Poughkeepsie, NY (US); Wing K. Luk, Chappqua, NY (US); Jeremy K. Stephens, New Windsor, NY (US); Daniel W. Storaska, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/870,755

(22) Filed: May 31, 2001

(65) Prior Publication Data

US 2002/0181307 A1 Dec. 5, 2002

(51) Int. Cl.[7] .................................................. G11C 7/02
(52) U.S. Cl. ....................................... 365/208; 365/203
(58) Field of Search ............................... 365/208, 207, 365/203, 206, 189.01, 189.04

(56) References Cited

U.S. PATENT DOCUMENTS 5,010,524 A    4/1991  Fifield et al. ............... 365/205
5,295,103 A  *  3/1994  Yamauchi .................... 365/156
5,901,102 A  *  5/1999  Furutani ................... 365/189.09
6,205,071 B1 *  3/2001  Ooishi ........................ 365/205

* cited by examiner

Primary Examiner—Vu A. Le
Assistant Examiner—Anh Phung
(74) Attorney, Agent, or Firm—Scully, Scott, Murphy & Presser; Robert A. Walsh, Esq.

(57) ABSTRACT

A single bitline direct sensing architecture employs a 4 transistor sense amplifier circuit located in each memory array, wherein the transistors function to selectively transfer data bits from either a true bitline or a complement bitline of the bitline pair to a data line. The data line is preferably arranged over a plurality of memory arrays. The data line may or may not be shared for the read and write operations. One current source is additionally used to precharge the datalines in a read mode, performing the function of a digital sensing scheme by detecting a resistance ratio between the current source and the transistor driven by the bitline for the corresponding array. A simple inverter may be used for detecting a level of the data line determined by the resistance ratio. The bitline pair is sensed in a single ended fashion, eliminating the need for a cross-coupled pair of CMOS devices, and thus reducing the required layout area. By accessing the bitline pair individually, two sets of control signals for the pre-charge, EQ0, EQ1, are developed to allow for bitline shielding in the array.

72 Claims, 4 Drawing Sheets

SINGLE BITLINE DIRECT SENSING ARCHITECTURE FOR HIGH SPEED MEMORY DEVICE

BACKGROUND OF THE INVENTION

1. Field of the Invention

The present invention relates to semiconductor memories, and more particularly pertains to a semiconductor memory employing a direct sensing scheme.

2. Discussion of the Prior Art

The evolution of sub-micron CMOS technology has resulted in significant improvement in microprocessor speeds. Quadrupling roughly every three years, microprocessor speeds have now even exceeded 1 Ghz. Along with these advances in microprocessor technology have come more advanced software and multimedia applications, requiring larger memories for the application thereof. Accordingly, there is an increasing demand for memories with higher density and performance.

Historically, direct sense circuitry has been added to the conventional cross-coupled CMOS pair sense amplifier in memory arrays to improve sensing speed. This is accomplished in two ways: firstly, the signal developed on the bitline can be transferred to the data line before a significant separation between the bitlines has been performed by the cross-coupled pair; and secondly, because the bitline is terminated into the gate of a transistor with its drain connected to the data line, the bitline and data line are de-coupled during the read operation.

Figure 1:
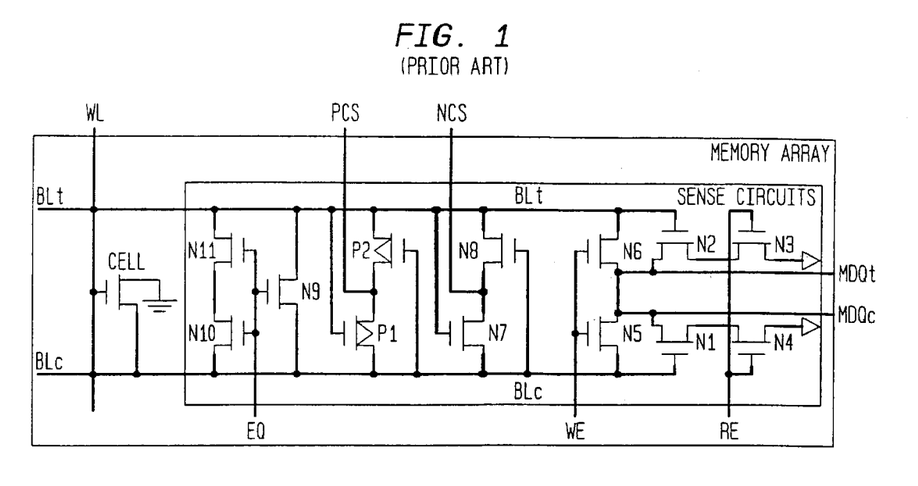
FIG. 1 illustrates a schematic circuit diagram of a direct sensing architecture as described in the prior art.

FIG. 1 is a circuit schematic for a direct sense amplifier architecture as described by the prior art. The conventional cross-coupled CMOS pair sense amplifier is comprised of devices N7, N8, P1, and P2. The devices N9, N10, and N11 make up the bitline pre-charge circuitry.

The four transistors N1, N2, N3, and N4 form the direct sense read circuitry. When the signal RE goes high, data on the bitlines (BLt and BLc) is transferred to differential data lines MDQt and MDQC. The devices N5 and N6 form a write mode switch to transfer data from the differential data lines MDQt and MDQc to the bitlines BLt and BLc.

Figure 2:
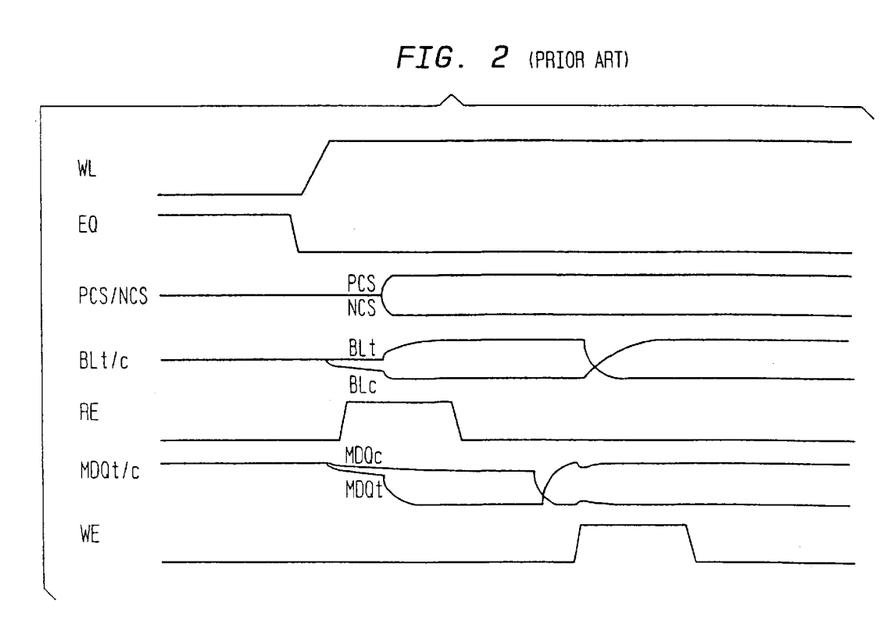
FIG. 2 shows timing diagrams to illustrate the read and write opposite data operations of the sense amplifier circuit of FIG. 1.

Referring to FIG. 2, the operation of the direct sense amplifier proceeds as follows utilizing a Vdd/2 pre-charge scheme. It is assumed that a storage cell stores a physical "0" data. When WL is activated, the physical "0" charge in the storage cell equalizes with charge on the bitline and BLc develops a small negative potential difference with respect to BLt. When the signal RE is asserted, a small differential signal (opposite in polarity with respect to the bitline signal) starts to develop on the data lines MDQt/c which were originally pre-charged to a high potential. As the PCS and NCS nodes are asserted, the cross-coupled pair begins to separate the bitlines, eventually realizing a full potential separation defined by the supply voltages of PCS and NCS. As the bitlines separate, the transistor N2 begins to turn on as BLt approaches the maximum value of PCS and pulls the data line MDQt to the ground potential. Conversely, transistor N1 turns off as BLc approaches the minimum value of NCS and MDQc remains at a high potential with respect to MDQt. A secondary sensing circuit (not shown) located at the opposite end of the data lines extracts the signal from the data lines. For a write mode, a signal WE goes high, and this couples the data lines MDQt and MDQ to the bitlines BLt and BLc. This functions to overwrite a data pattern on the bitlines BLt and BLc by forcing the bitline voltage by the MDQt and MDQc to the corresponding data pattern.

The advantage of this direct sensing scheme can be realized by observing that the signal is transferred to the data lines as it develops on the bitlines. Direct sense amplification accelerates the signal transfer as compared to a conventional cross-coupled sense amplifier operation as the later requires that the separation on the bitlines be enough that coupling to the heavily capacitive data lines through pass gates does not destroy the signal on the bitlines. Further, for this reason, the timing of the RE signal for the direct sense amplifier operation in comparison to the CSL (column select line) of the conventional approach is much less critical. This results in a high speed access time.

The existing direct sensing scheme does, however, have three disadvantages. (1) Additional direct sensing devices increase the silicon area. (2) A cycle time is not improved, because it is determined by a signal write back operation, which consists of a signal development on the bitlines, CMOS cross-coupled sensing operation, and writing back the amplified signal on the bitline to the capacitor of the cell. (3) The intra and inter bitline coupling noise in a CMOS cross-coupled sensing operation remains, reducing a signal margin.

SUMMARY OF THE INVENTION

The present invention:

improves memory cycle time by using a single bitline direct sensing architecture.

reduces memory silicon area by using a single bitline direct sensing architecture.

improves memory sensing margin by shielding every other bitline by using a single bitline direct sensing architecture.

reduces memory cycle time by allowing a small bitline swing in a read mode with a single bitline direct sensing architecture.

reduces memory cycle time by naturally allowing a precondition for a delayed write in a destructive read architecture.

provides a method to sense a cell voltage without having a CMOS cross coupled-sense amplifier.

improves a bandwidth of a memory cell by transferring all of the data bits activated by the wordline simultaneously.

provides a method to transfer all of the data bits sensed into the data lines simultaneously without having a wiring problem.

provides a method to arrange the read and write data lines over the array to allow all of the data bits accessed in a first memory array to be read, while allowing all the data bits accessed in a second memory array to be written without having a wiring problem.

senses a data bit with a simple inverter.

improves memory sensing margin by shielding every other bitline by independently controlling the bitline precharge circuitry and multiplexer with a CMOS Cross-coupled sense amplifier.

In a first aspect of the invention, there is provided a single bitline sensing architecture for dynamic random access memories. The single bitline sensing architecture employs a NMOS device, which couples to the bitline (gate), the single global data line (drain), and a switching device (source). Alternatively, the single bitline sensing architecture employs a NMOS device, which couples to the bitline (gate), a switching device (drain) to couple the single global data line, and the ground potential node (source). The NMOS conductance is changed when the data bit is transferred to the bitline in a signal development phase. By enabling the switching device, the NMOS conductance difference for a 0 and 1 data bit is globally detected by monitoring a voltage on the data line. This results in a digital sensing scheme with a simple inverter coupling to the single global data line. Because of this simplicity, all of the data bits activated by the wordline can be transferred to the corresponding single global data lines simultaneously without having a global wiring problem. This results in an ultimate bandwidth. Optionally, the current may be monitored on the single global data line with a current sensing scheme.

In another aspect of the invention, there is a provided a single bitline sensing architecture for short cycle time dynamic random access memories. By employing a destructive read architecture (A Destructive Read Architecture for Dynamic Random Access Memories, FIS92000411, Kirihata et al.), no CMOS cross-cross-coupled sense amplifiers are required, since a write mode operation is scheduled as a delayed write described in the destructive read architecture. This results in a small silicon area while enabling a small bitline voltage swing sensing scheme for further improving cycle time. The VDD precharged bitline without having a CMOS cross-coupled sense amplifiers naturally generates a precondition state (Method and Apparatus for Reducing Write Operation Time in Dynamic Random Access Memories, FIS920000410US1, Kirihata et. Al.) for a future delayed write back, further improving a cycle time in a write mode.

In yet another aspect of the invention, there is provided a single bitline sensing architecture for shielding bitline in a sensing operation. The single bitline sensing architecture allows every other bitlines to be used for shielding the other every other bitlines in a sensing operation, increasing memory sensing margin.

DESCRIPTION OF THE PREFERRED EMBODIMENTS

Figure 3A:
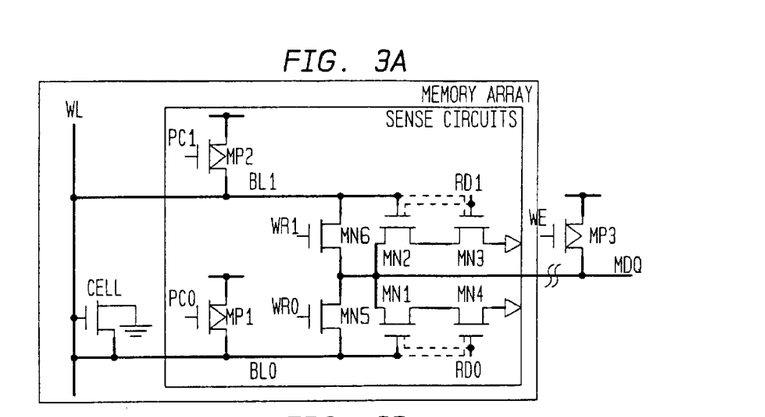
FIG. 3(a) is a schematic circuit diagram of a first embodiment of a direct sense amplifier pursuant to the present invention.

FIG. 3(a) is a schematic diagram of a first embodiment of a direct sense amplifier pursuant to the present invention. Here, the four transistors of the cross-coupled CMOS pair have been removed. The equalization switching devices are replaced with two P-channel transistors MP1/2 which are independently controllable.

In the preferred embodiment, a Vdd sensing scheme will be addressed, but the present invention can be applied to a Vdd/2 or GND sensing scheme by altering the pre-charge voltage level, and adjusting circuit elements accordingly. A Vdd sensing scheme maintains the devices MN1 and MN2 in the on state and provides for reduced leakage in the array since bitline to word line coupling is in the opposing direction.

The read function is performed solely by a set of four transistors MN1, MN2, MN3, and MN4. A current source MP3 is coupled to a data line MDQ to supply charge to the data line MDQ. The current source MP3 preferably supports a plurality of memory arrays, each containing a set of four transistors MN1, MN2, MN3, and MN4. A transistor MN1 has a control gate and a current path, the control gate coupled to a bitline BL0 of the memory array, the current path coupled between the data line MDQ and a current path of a transistor MN4. The transistor MN4 has a control gate and a current path, the control gate coupled to a read enable signal RD0 of the memory array, the current path coupled between the current path of the MN1 transistor and a ground potential. A transistor MN2 has a control gate and a current path, the control gate coupled to a bitline BL1 of the memory array, the current path coupled between the data line and a current path of a transistor MN3. The transistor MN3 has a control gate and a current path, the control gate coupled to a read enable signal RD1 of the memory array, the current path coupled between the current path of the third transistor and a ground potential.

The sense amplifier circuit further comprises a transistor MN5 having a control gate and a current path, the control gate coupled to a write enable signal WR0 of the memory array, the current path coupled between the read/write data line MDQ and the bitline BL0 of the memory array. A transistor MN6 has a control gate and a current path, the control gate coupled to a second write enable signal WR1 of the memory device, the current path coupled between the data line MDQ and the bitline BL1 of the memory array.

The data line MDQ is a bi-directional signal, supporting a read and write operation as a time multiplexing manner. The MDQ also supports the data bits on the bitlines BL0 and BL1, reducing the number of the MDQs by half. This relaxes the MDQ wiring pitch by as much as 2 of the existing direct sensing scheme shown in FIG. 1. The time multiplexing operation for the data line MDQ is controlled by RD0, RD1, and WD0, and WD1, respectively. More specifically, the read enable signals RD0/1 are coupled to the control gates of the MN4 and MN3 transistors, respectively, and are utilized to provide multiplexing between the bitlines BL0 and BL1 to selectively couple to the data line MDQ during a read operation. The write enable signals WR0/1 are coupled to the control gates of the MN5 and MN6 transistors, respectively, and are utilized to provide multiplexing between bitlines BL0 and BL1 to selectively couple from the data line MDQ during a write operation.

A seventh transistor MP1 has a control gate and a current path, the control gate coupled to a pre-charge signal PCO of the memory device, the current path coupled between the bitline BL0 of the memory array and a reference supply terminal. A transistor MP2 has a control gate and a current path, the control gate coupled to a precharge signal PC1 of the memory array, the current path coupled between the bitline BL1 of the memory device and a reference supply terminal.

The pre-charge signals PC0/1 are controlled during the read operation such that when a signal is developing on the bitline BL0 of the memory array, the precharge signal PC0 disables the precharging operation of the bitlne BL0, and the precharge signal PC1 keeps precharging the bitline BL1 at voltage supply level (VDD).

Each of the transistors MN1, MN4, MN2, MN3, MN5, MN6 are N-channel transistors, and each of the transistors MP1, MP2 are P-channel transistors. However, the invention is not limited in these transistor configuration. For example, for PMOS memory cells with grounded bitline precharged sensing scheme, MP1 and MP2 may preferably be NMOS transistors, and MN1, MN2, MN3 and MN4 may preferably be PMOS transistors.

The current source MP3 is comprised of a P-channel transistor having a control gate and a current path, the control gate is coupled to a control terminal WE, and the current path coupled between a voltage supply terminal (VDD) and the data line MDQ.

The current source MP3 is preferably common to a plurality of memory arrays. The 8 transistors MN1, MN2, MN3, MN4, MN5, MN6, MP1, and MP2 are preferably arranged in each array, while sharing the current source transistor MP2 for a plurality of memory arrays. Typically, 4 to 16 memory arrays are coupled to the same data line MDQ, where one current source transistor MP3 is designed. The current source transistor MP3 for the data line MDQ can be an N-channel transistor, a device, a resistance, or any other means.

The 8 transistors in each array functions to transfer the data bits and receive the data bits from the corresponding data line MDQ. The data lines MDQ are arranged over the memory arrays, resulting in no additional silicon area. A bitline voltage after the signal development is realized by simply detecting a voltage level of the data line MDQ. The MDQ voltage level is determined by a resistance ratio between the current source MP3 and the current path through MN1 and MN4 for BL0 (or MN2 and MN3 for BL2) driven by the bitline for the corresponding array. A simple inverter coupling to the MDQ may be used for the detection of the MDQ voltage. Because the bitlines do not fully swing, a bitline precharging time is improved. In addition, a read mode in a destructive read architecture is used for writing a high data bit because bitlines in a read mode is precharged to a VDD and the bitlines don't swing. This thus generates a precondition level in memory cells for a future delayed write in a destructive read architecture. These result in improving a read and write cycle times of dynamic random access memories. The destructive read and precondition for improving a cycle time are well discussed in the applications, FIS92000411, Kirihata et al, and, FIS92000410, Kirihata et al, therefore are not discussed.

The gate terminal of the current source transistor MP3 is controlled by the signal WE, which is an ORed signal of WR0 and WR1. The signal WE remains low to precharge the data line MDQ during a read operation. For a write mode, the signal WE goes high, the current source transistor is off, allowing a MDQ to be used for a write mode operation.

Figure 4:
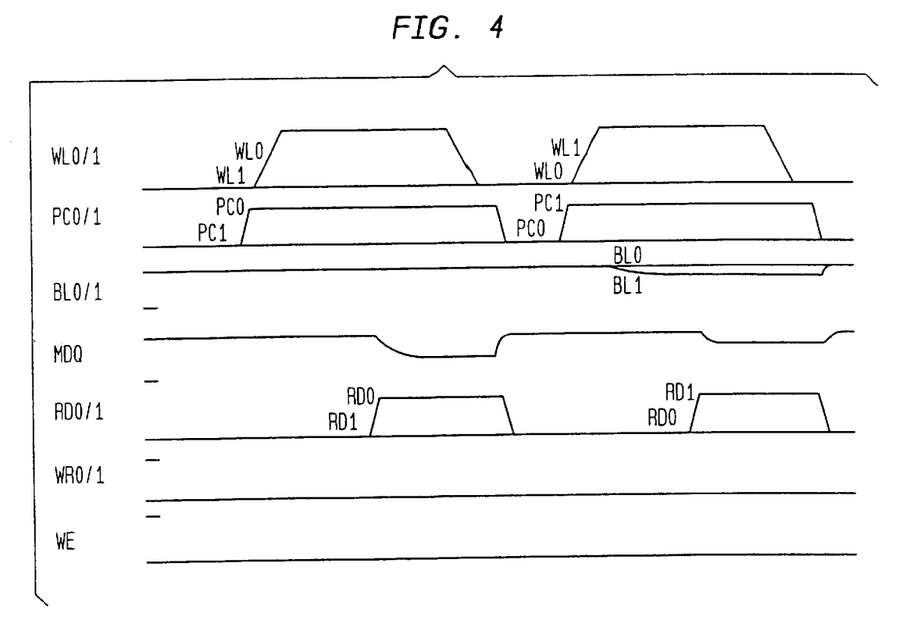
FIG. 4 shows timing diagrams to illustrate the read operation of the sense amplifier circuits of FIG. 3(a) for both a zero (0) and one (1) data type.

FIG. 4 illustrates the operation of the circuits of FIG. 3(*a*) of the present invention. The first cycle is the read operation of a one (1) data type. When the WL is activated, the PC0 signal is deactivated (brought high) while the PC1 signal remains asserted to keep BL1 coupled to the pre-charge voltage of VDD for signal shielding. A separate control circuit (not shown) is utilized to provide the decoding and generation of the correct PC0/1, RD0/1, and WR0/1 signal dependent upon the WL selected (and read or write command). For reading a data pattern of 1, the BL0 maintains a high potential. Therefore the MN1 device remains on. This reduces the conductivity of the device MN1. When the RD0 signal is asserted, current flows from the current supply circuit, which is represented by MP3, through transistors MN1 and MN4 to the ground potential. The voltage developed on the MDQ for this data type is a lower potential than for the zero (0) data type shown in the second cycle of FIG. 4. This is due to the fact that the gate overdrive of transistor MN1 is greater for a one (1) data type than for a zero (0) data type. A secondary sense amplifier (not shown) is located at the opposite end of the MDQ to detect the difference between a one (1) and zero (0) data type. A simple inverter may be used for the detection of the MDQ voltage as a second sense amplifier as discussed previously.

In an exemplary write cycle, the data is written from the MDQ to BL0/1 of the bitline pair based upon the selection of pass transistors MN5 or MN6 with control gate signals WR0/1, respectively. During a write command, the control gate of transistor MP3, coupled to the WE signal, is brought to a high potential to turn off the current supply to the MDQ. Optionally, MN5 and MN6 may be coupled to a write data line MDQW which is different from the read data line MDQR coupling to MN1 and MN2. Optionally, MP3 may be turned off prior to the activation of RD, to save or prevent the DC current flow in a read mode.

FIG. 3(*a*) also illustrates in dashed lines a modified embodiment of a direct sense amplifier pursuant to the present invention wherein the transistor MN1 and the transistor MN2 have their gates connected respectively to the read enable signals RD0/1, and the transistor MN4 and the transistor MN3 have their gates connected respectively to the bitline signals BL0/1, wherein the operations thereof are substantially similar to the operations described above. This alternative approach decouples the MDQ from a device load capacitance due to MN1–4, because the MN1 and MN2 gated by RDs are off for inactivated memory arrays. This is particularly important for the data line MDQ to support more memory arrays.

Figure 3B:
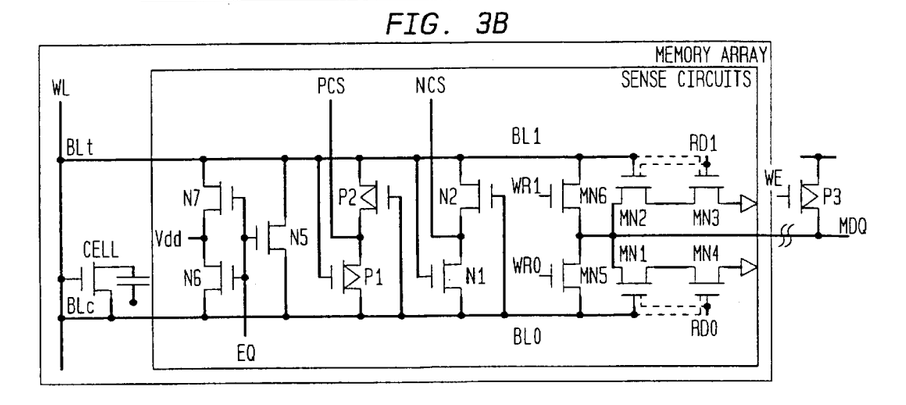
FIG. 3(b) is a schematic circuit diagram of a second embodiment of a direct sense amplifier pursuant to the present invention.

FIG. 3(*b*) illustrates a second embodiment of a direct sense amplifier pursuant to the present invention wherein a traditional cross coupled CMOS sense amplifier functions to sense a data bit of the bitline data. The cross coupled amplifier P1, P2, N1, N2, and precharge circuitry N5, N6, N7 are substantially the same as shown in FIG. 1. The direct sensing circuit on the right side of FIG. 3*b* operates similarly to the direct sensing circuit on the right side of FIG. 3*a*. More particularly, it enables the read enable signals RD0 and RD1 to couple either BL0 or BL1 to the MDQ respectively, depending on whether the data originated from a storage cell coupled to BL0 or BL1. For a write mode, it enables the write enable signals WR0 and WR1 to couple the MDQ to either BL0 or BL1 respectively, depending on whether the data to be written to a storage cell is coupled to BL0 or BL1.

As is well known, a CMOS cross coupled sense latch has the advantage of differential sensing and inherent common mode noise rejection, but traditionally required output data lines connected to both true and complement sides of the latch to avoid a read disturb. The single MDQ employed in a single bitline direct sensing architecture increases data and the bandwidth, to as large as 2× of a differential MDQ architecture. This method may also be applicable for a conventional DRAM without sensing a destructive read architecture, because a write back is realized by the CMOS cross-coupled sense amplifier as in a conventional manner. In destructive read memory architectures with a delayed write mode where all data bits along a wordline are sensed and stored elsewhere, there may not be wiring space available for double data lines for each bit, as is required in the prior art of FIG. 1.

In technologies where a pair of data lines can fit per sense amp, an additional advantage of the sensing circuit of FIG. 3(b) is to permit the inclusion of separate read and write data lines, such that a read operation can occur simultaneously in a first memory array with the read data lines, while performing a write operation in a second memory array with the write data lines.

Figure 3C:
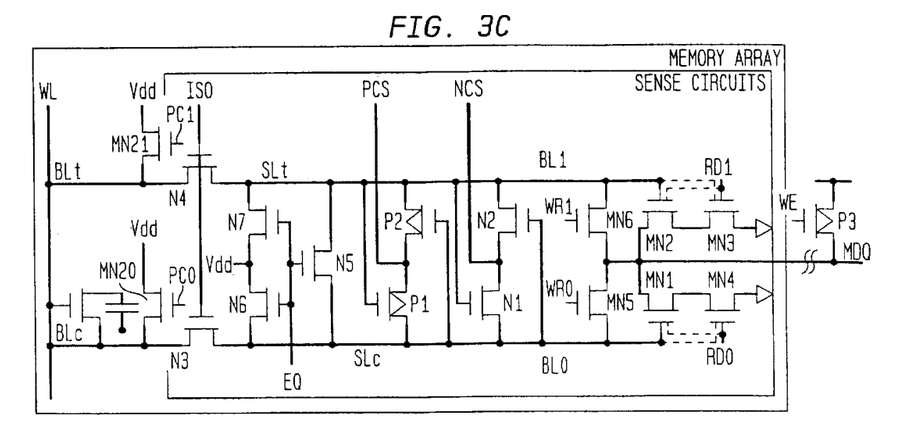
FIG. 3(c) shows another embodiment wherein two bitline precharging devices MN 20 (gated by PC0) and MN21 (gated by PC1) are coupled to the BLc and BLt lines, respectively.

FIG. 3(c) shows another embodiment. Unlike the embodiment shown in FIG. 3b, two bitline precharging transistors MN 20 (gated by PC0) and MN21 (gated by PC1) are coupled to the BLc and BLt lines, respectively. Bit line isolator transistors M3 and M4 are additionally designed to couple the bit lines BLc and BLt to the sense lines SLc and SLt. These additional controlling schemes allows a bitline shielding even with a CMOS cross coupled sense amplifier. When the BLc line is used for sensing, PC0 and PC1 are off and on, respectively, similar to the first embodiment shown in FIG. 3a. During the signal development phase, the ISO signal is periodically on, allowing the signal developed on the BLc to be transferred to the sense node SLc, while shielding the BLt and Slc lines by the precharge device MN21. Prior to activation of the NCS and PCS, the ISO signal is turned off. The BLs are immediately precharged after the ISO is turned off.

The CMOS sense amplifier (MN1 MN2, MP1 and MP2) amplifies the signal on the SL node, which is further amplified by the enabled direct sensing devices, similar to the FIG. 3b. Optionally, the ISO signal can be turned on after the CMOS cross coupled SA has amplified the SL signal for direct write back to the cell, as in a conventional sensing scheme. In this case, the precharge signal PC0 and PC1 should not be activated until the signal is sufficiently written to the cell and WL is turned off. Optionally, a conventional pass gate column switch may be used to couple the BL pair to the MDQ pair by activating a Column-Select-Signal CSL, while still allowing a BL shielding feature by controlling ISO and independently control PC0 and PC1. Optionally, the two ISO transistors N3 and N4 may be independently controlled. In this option, only transistor N3 is periodically on to transfer the signal from the BLc to SLc during a signal development. The transistor N3 is turn off, and then activating the CMOS cross-coupled sense amplifier (N1, N2, P1, and P2). In order to write back a signal, the device N3 is turn on, allowing the sense data on the SLc to be transferred to the BLc. During this period, the BLt remains precharged while isolating SLt from the BLt by the isolator transistor N4. This allows the BL0 shielded even during a signal write back operation, which is not realized in the common ISO transistor control method.

Figure 5:
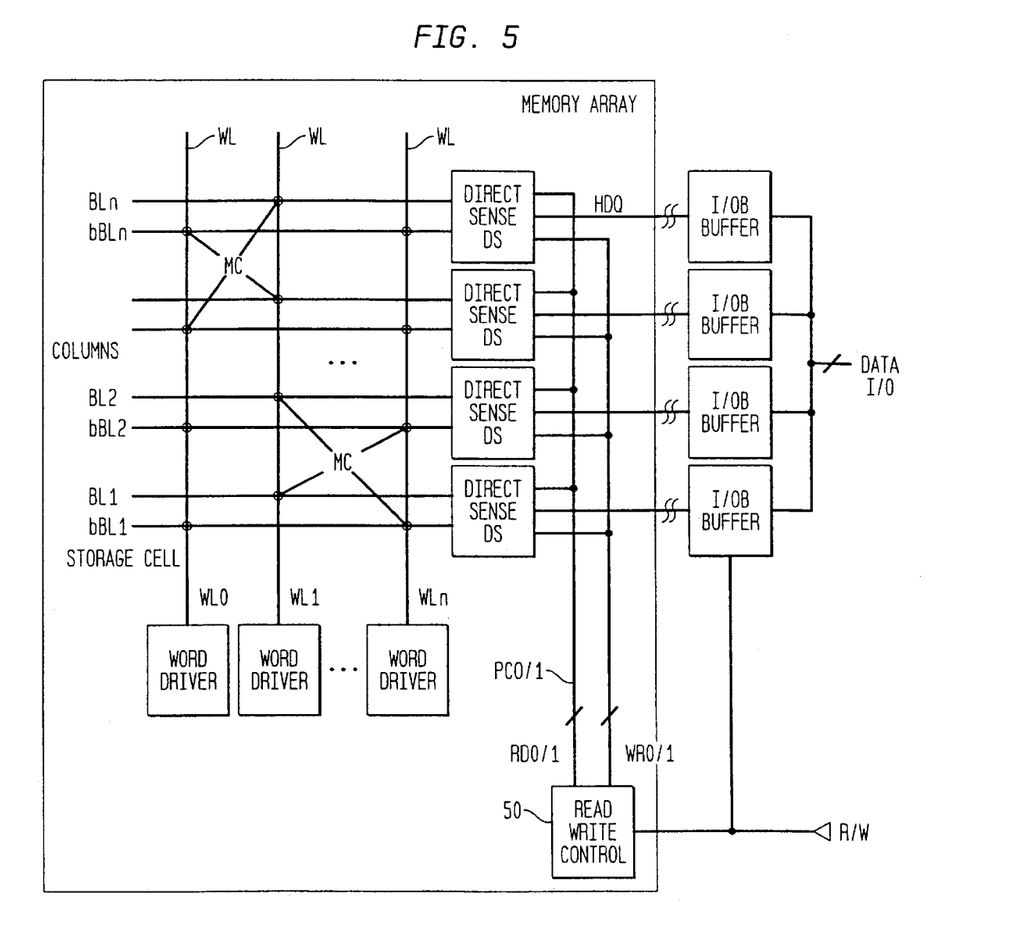
FIG. 5 illustrates a dynamic random access memory comprising an array of storage cells arranged in rows and columns, each column including a bitline pair BL coupled to a plurality of the memory cell MS.

FIG. 5 illustrates a dynamic random access memory comprising a plurality of memory arrays. Each memory contains a plurality of storage memory cells MC arranged in rows and columns, each column including a bitline pair BL coupled to a plurality of the memory cells MC. A control circuit 50 generates two precharge signals PC0/1, two read control signals RD0/1, and two write control signals WR0/1. A plurality of input/output buffer I/OB circuits, each containing a current source transistor (MP3 in FIG. 3) receive data signals Data and supply data signals to a plurality of direct sense DS amplifier circuits (MN1, MN2, MN3, MN4, MN5, MN6, MP1 and MP2 in FIG. 3), as illustrated in FIG. 3. Each direct sense amplifier circuit has control terminals coupled to receive the read and write control signals from the control circuit 50. Each direct sense amplifier circuit applies data from one of the two bitlines of the bitline pair to the data line in response to the read control signals RD0/1, while shielding the other bit line by the precharge signal PC0/1. For a write mode each direct sense amplifier circuit applies data from the data line to one of the two bitlines of the bitline pair in response to the write control signals WR0/1 while shielding the other bitline by the precharge signal PC0/1. In this example, it is assumed that all data bits are read or written simultaneously. Optionally, the signals RD0/1 and WD0/1 may be decoded with a column address. Optionally, the input/output buffer I/OB may be split into a input buffer (IB) coupling to the read data line (MDQR) with a current source transistor (MP3 in FIG. 3), and an output buffer (OB) coupling to the write data line (MDQW). This separate MDQR and MDQR architecture allows data bits in a first array to be read while simultaneously data bits in a second array to be written.

While the invention has been described with particular reference to several preferred embodiments, it will be understood by those skilled in the art that certain modifications can be made to adapt the invention to a particular situation, and that some circuit elements of the preferred embodiment can be substituted for others performing the same function without departing from the scope and spirit of the present invention.

Having thus described our invention, what we claim as new, and desire to secure by Letters Patent is:

1. A sense amplifier circuit for a memory array, wherein the read function is performed solely by a set of four transistors and a current source comprising:
   a current source coupled to a read data line to supply charge to the read data line;
   a first transistor having a control gate and a current path, the control gate coupled to a first bitline of the memory array, the current path coupled between the read data line and a current path of a second transistor;
   the second transistor having a control gate and a current path, the control gate coupled to a first read enable signal of the memory array, the current path coupled between the current path of the first transistor and a ground potential;
   a third transistor having a control gate and a current path, the control gate coupled to a second bitline of the memory array, the current path coupled between the read data line and a current path of a fourth transistor;
   the fourth transistor having a control gate and a current path, the control gate coupled to a second read enable signal of the memory array, the current path coupled between the current path of the third transistor and a ground potential;
   wherein the first and second read enable signals which are coupled to the control gates of the second and fourth transistors, respectively, are utilized to provide multiplexing between the first and second bitlines to the read data line during a read operation.

2. A sense amplifier circuit as in claim 1, further comprising:
   a fifth transistor having a control gate and a current path, the control gate coupled to a first write enable signal of the memory array, the current path coupled between a write data line and the first bitline of the memory array;
   a sixth transistor having a control gate and a current path, the control gate coupled to a second write enable signal of the memory array, the current path coupled between the write data line and the second bitline of the memory array;

wherein the first and second write enable signals which are coupled to the control gates of the fifth and sixth transistors, respectively, are utilized to provide multiplexing between the first and second bitlines to the write data line during a write operation.

3. A sense amplifier as in claim 2 wherein said read data line and said write data line comprise a bi-directional read/write data line.

4. A sense amplifier circuit as in claim 3, wherein the current source is comprised of a P-channel transistor having a control gate and a current path, the control gate is coupled to a control terminal, and the current path is coupled between a voltage supply terminal and the read/write data line, wherein the control terminal is coupled to receive a first logic state of a third write enable signal for allowing charge to flow from the voltage supply terminal onto the read/write data line during a read operation, and wherein the control terminal is coupled to receive a second logic state of the third write enable signal to turn off the current source during a write operation.

5. A sense amplifier circuit as in claim 3, wherein the sense amplifier circuit is one memory array, and the read/write data line is arranged over a plurality of memory arrays.

6. A sense amplifier circuit as in claim 2, wherein the sense amplifier circuit is in one memory array, and the write data line is arranged over a plurality of memory arrays.

7. A sense amplifier circuit as in claim 1, further comprising:
a seventh transistor having a control gate and a current path, the control gate coupled to a first pre-charge signal of the memory array, the current path coupled between the first bitline of the memory array and a reference supply terminal;
an eighth transistor having a control gate and a current path, the control gate coupled to a second pre-charge signal of the memory array, the current path coupled between the second bitline of the memory array and a reference supply terminal;
wherein the first and second pre-charge signals are controlled during the read operation such that when a signal is developing on the first bitline of the memory array, the first pre-charge signal is not asserted and the second pre-charge signal is asserted to keep the second bitline pre-charged.

8. A sense amplifier circuit as in claim 7, wherein each of the first, second, third, and fourth transistors are N-channel transistors and each of the seventh and eighth transistors are P-channel transistors.

9. A sense amplifier circuit as in claim 1, further comprises a conventional cross-coupled pair of CMOS sense amplifier transistors.

10. A sense amplifier circuit as in claim 9, wherein the first and second bitlines further include an isolator device between the memory array and the sense amplifier circuit to couple the first and second bitlines in the memory array to the first and second bitlines in the sense amplifier.

11. A sense amplifier circuit as in claim 1, wherein the sense amplifier circuit is in one memory array, and the read dataline, is arranged over a plurality of memory arrays.

12. A sense amplifier circuit as in claim 1, wherein the sense amplifier circuit is in one memory array, and the current source is shared between a plurality of memory arrays.

13. A sense amplifier circuit as in claim 1, wherein the bitline voltage is precharged to Vdd.

14. A sense amplifier circuit as in claim 1, wherein the first bitline in the memory array further includes a first bitline precharge device gated by a first precharge signal, and the second bitline in the memory array includes a second bitline precharge device gated by a second precharge signal.

15. A sense amplifier circuit as in claim 14, wherein when the first bitline in the memory array is used for sensing, the first and second precharge signals are off and on, respectively, during a signal development phase, and the isolator device is on, allowing the signal developed on the first bitline in the memory array to be transferred to the first bitline in the sense amplifier circuit, while shielding the first bitline in the memory array by the second bitline in the memory array.

16. A sense amplifier circuit for a memory device, wherein the read function is performed solely by a set of four transistors and a current source comprising:
a current source coupled to a read data line to supply charge to the read data line;
a first transistor having a control gate and a current path, the control gate coupled to a first read enable signal of the memory array, the current path coupled between the read data line and a current path of a second transistor;
the second transistor having a control gate and a current path, the control gate coupled to a first bitline of the memory array, the current path coupled between the current path of the first transistor and a ground potential;
a third transistor having a control gate and a current path, the control gate coupled to a second read enable signal of the memory array, the current path coupled between the read data line and a current path of a fourth transistor;
the fourth transistor having a control gate and a current path, the control gate coupled to a second bitline of the memory array, the current path coupled between the current path of the third transistor and a ground potential;
wherein the first and second read enable signals which are coupled to the control gates of the first and third transistors, respectively, are utilized to provide multiplexing between the first and second bitlines to the read data line during a read operation.

17. A sense amplifier circuit as in claim 16, further comprising:
a fifth transistor having a control gate and a current path, the control gate coupled to a first write enable signal of the memory array, the current path coupled between the write data line and the first bitline of the memory array;
a sixth transistor having a control gate and a current path, the control gate coupled to a second write enable signal of the memory array, the current path coupled between the write data line and the second bitline of the memory array;
wherein the first and second write enable signals which are coupled to the control gates of the fifth and sixth transistors, respectively, are utilized to provide multiplexing between the first and second bitlines to the write data line during a write operation.

18. A sense amplifier as in claim 17, wherein said read data line and said write data line comprises a bi-directional read/write data line.

19. A sense amplifier circuit as in claim 18, wherein the current source is comprised of a P-channel transistor having a control gate and a current path, the control gate is coupled to a control terminal, and the current path is coupled between a voltage supply terminal and the read/write data line, wherein the control terminal is coupled to receive a first logic state of a third write enable signal for allowing charge to flow from the voltage supply terminal onto the read/write data line during a read operation, and wherein the control terminal is coupled to receive a second logic state of the third write enable signal to turn off the current source during a write operation.

20. A sense amplifier circuit as in claim 18, wherein the sense amplifier circuit is in one memory array, and the read/write line is arranged over a plurality of memory arrays.

21. A sense amplifier circuit as in claim 17, wherein the sense amplifier circuit is one memory array, and the write data line is arranged over a plurality of memory arrays.

22. A sense amplifier circuit as in claim 16, further comprising:
 a seventh transistor having a control gate and a current path, the control gate coupled to a first pre-charge signal of the memory array, the current path coupled between the first bitline of the memory array and a reference supply terminal;
 an eighth transistor having a control gate and a current path, the control gate coupled to a second pre-charge signal of the memory array, the current path coupled between the second bitline of the memory array and a reference supply terminal;
 wherein the first and second pre-charge signals are controlled during the read operation such that when a signal is developing on the first bitline of the memory array, the first pre-charge signal is not asserted and the second pre-charge signal is asserted to keep the second bitline pre-charged.

23. A sense amplifier circuit as in claim 22, wherein each of the first, second, third, and fourth, transistors are N-channel transistors and each of the seventh and eighth transistors are P-channel transistors.

24. A sense amplifier circuit as in claim 16, further comprising a conventional cross-coupled pair of CMOS sense amplifier transistors.

25. A sense amplifier circuit as in claim 24, wherein the first and second bitlines further include an isolator device between the memory array and the sense amplifier circuit to couple the first and second bitlines in the memory array to the first and second bitlines in the sense amplifier circuit.

26. A sense amplifier circuit as in claim 25, wherein the first bitline in the memory array further includes a first bitline precharge device gated by a first precharge signal, and the second bitline in the memory array includes a second bitline precharge device gated by a second precharge signal.

27. A sense amplifier circuit as in claim 26, wherein when the first bitline in the memory array is used for sensing, the first and second precharge signals are off and on, respectively, during a signal development phase, and the isolator is on, allowing the signal developed on the first bitline in the memory array to be transferred to the first bitline in the sense amplifier circuit, while shielding the first bitline the second bitline in the memory array.

28. A sense amplifier circuit as in claim 16, wherein the sense amplifier circuit is in one memory array, and the read dataline, is arranged over a plurality of memory arrays.

29. A sense amplifier circuit as in claim 16, wherein the sense amplifier circuit is in one memory array, and the current source is shared between a plurality of memory arrays.

30. A sense amplifier circuit as in claim 16, wherein the bitline voltage is precharged to Vdd.

31. A dynamic random access memory comprising:
 an array of storage cells arranged in rows and columns, each column including a bitline pair coupled to a plurality of the memory cells;
 a control circuit which generates two read control signals;
 an output buffer circuit which outputs data signals;
 a read data line coupled to the output buffer circuit; and
 a direct sense amplifier circuit having control terminals coupled to receive the read control signals, the direct sense amplifier circuit applying data from one of the two bitlines of the bitline pair to the read data line in response to the read control signals.

32. A dynamic random access memory as in claim 31, wherein the direct sense amplifier circuit comprises a set of four transistors and a current source comprising:
 a current source coupled to the read-data line to supply charge to the read data line;
 a first transistor having a control gate and a current path, the control gate coupled to a first bitline of the memory array, the current path coupled between the read data line and a current path of a second transistor;
 the second transistor having a control gate and a current path, the control gate coupled to a first read enable signal of the memory array, the current path coupled between the current path of the first transistor and a ground potential;
 a third transistor having a control gate and a current path, the control gate coupled to a second bitline of the memory array, the current path coupled between the read data line and a current path of a fourth transistor;
 the fourth transistor having a control gate and a current path, the control gate coupled to a second read enable signal of the memory array, the current path coupled between the current path of the third transistor and a ground potential;
 wherein the first and second read enable signals which are coupled to the control gates of the second and fourth transistors, respectively, are utilized to provide multiplexing between the first and second bitlines to the read data line during a read operation.

33. A dynamic random access memory as in claim 32, wherein said output buffer circuit includes an inverter, which detects a voltage level of said read dataline.

34. A dynamic random access memory as in claim 31, the direct sense amplifier circuit comprises a set of four transistors and a current source comprising:
 a current source coupled to the read data line to supply charge to the read data line;
 a first transistor having a control gate and a current path, the control gate coupled to a first read enable signal of the memory array, the current path coupled between the read data line and a current path of a second transistor;
 the second transistor having a control gate and a current path, the control gate coupled to a first bitline of the memory array, the current path coupled between the current path of the first transistor and a ground potential;
 a third transistor having a control gate and a current path, the control gate coupled to a second read enable signal of the memory array, the current path coupled between the read data line and a current path of a fourth transistor;
 the fourth transistor having a control gate and a current path, the control gate coupled to a second bitline of the memory array, the current path coupled between the current path of the third transistor and a ground potential;
 wherein the first and second read enable signals which are coupled to the control gates of the first and third transistors, respectively, are utilized to provide multiplexing between the first and second bitlines to the read data line during a read operation.

35. A method of writing and reading data in a memory device including the steps of:

applying datum to a data line;

applying a pair of write control signals to the control gate of a first transistor with a current path connected between the data line and a first bitline, and also to the control gate of a second transistor with a current path connected between the data line and a second bitline, the write control signals are applied to turn on the first transistor and turn off the second transistor in order to allow the datum on the data line to be applied to the first bitline, or vice versa;

storing the datum in a memory cell connected to the first bitline;

applying a pair of read control signals to the control gate of a third transistor with a current path connected in series with a current path of a fourth transistor and a ground potential, and also to the control gate of a fifth transistor with a current path connected in series with a current path of a sixth transistor and a ground potential, the read control signals applied to turn on the third transistor and turn off the fifth transistor to allow the current path of the fourth transistor, and the voltage on the data line, to be controlled by the signal on the first bitline which is coupled to the control gate of the fourth transistor, or vice versa.

36. Within an integrated circuit, a method of sensing a stored bit signal from a bitline for output onto an output data line, comprising:

precharging said bitline;

after said step of precharging, transferring said stored bit signal onto said bitline;

applying said stored bit signal from said bitline only to a control terminal of a control device coupled to a single-ended output data line to control an output signal level on said single-ended output data line, said control device being placed in a current path with said single-ended output data line.

37. The method of claim 36, further comprising timing said step of applying with a read signal to a read timing device.

38. The method of claim 37, further comprising applying said read signal to a read timing device placed in a current path with said single-ended output data line and a fixed potential.

39. The method of claim 36, further comprising sourcing current during said step of applying to said single-ended output data line.

40. The method of claim 39, further comprising coupling an inverter to said output data line, which detects the single-ended output data line voltage as a sense amplifier.

41. The method of claim 36, wherein said step of precharging is performed using only a precharge device having a current path between said bitline and a fixed potential.

42. The method of claim 36, further comprising, precharging a second bitline;

after the step of precharging the second bitline, transferring a second stored bit signal onto the second bitline;

applying a second stored bit signal through said second bitline only to a control terminal of a second control device coupled to said single-ended output data line to control an output signal level on said single-ended output data line, said second control device being placed in a current path with said single-ended output data line.

43. The method of claim 42, further comprising timing said step of applying a second stored bit signal with a second read signal applied to a second read timing device.

44. The method of claim 42, wherein said step of precharging said second bitline is performed during said step of applying said stored bit signal from said bitline.

45. The method of claim 44, wherein said step of precharging said bitline is performed during said step of applying said second stored bit signal from said second bitline.

46. A semiconductor memory device comprising:

a memory array comprising at least one bitline pair, each comprising a true bitline and a complement bitline;

means to selectively couple either the true bitline or the complement bitline of said at least one bitline pair to a data line, while the other uncoupled bitline is precharged.

47. A semiconductor memory as in claim 46, wherein said data line is prepared for each bitline pair, thus allowing all data bits in said memory array to couple to the corresponding data line simultaneously.

48. A semiconductor memory as in claim 46, wherein said means is to selectively couple, enabled in a read mode.

49. A semiconductor memory as in claim 46, wherein said means to selectively couple, is enabled in a write mode.

50. A semiconductor memory device comprising:

a memory array comprising at least one bitline pair, each comprising a true bitline and a complement bitline;

a first means to selectively couple either the true bitline or the complement bitline of said at least one bitline pair to a first data line, while the other uncoupled bitline is precharged in a read mode;

a second means to selectively couple either the true bitline or the complement bitline of said at least one bitline pair to a second data line, while the other uncoupled bitline is precharged in a write mode.

51. A semiconductor memory as in claim 50, wherein said first and second data lines comprise a common data line.

52. A semiconductor memory device comprising:

first memory array and a second memory array, wherein each of said memory arrays comprises at least one bitline pair, each comprising a true bitline and a complement bitline controlled by first and second means;

the first means in the first memory array to selectively couple either the true bitline or the complement bitline of said at least one bitline pair to a first data line, while the other uncoupled bitline is precharged in a read mode, the second means in the second memory array selectively couples either the true bitline or the complement bitline of said at least one bitline pair to a second data line, while the other uncoupled bitline is precharged in a write mode;

thus enabling a read mode and a write mode for the first and second memory arrays simultaneously.

53. A semiconductor memory as in claim 52, wherein said read data line and said write data line are prepared for each bitline pair, thus allowing all data bits in said first memory array to couple to the corresponding read data line simultaneously, while allowing all data bits in said second memory array to couple to the corresponding write data line simultaneously.

54. Within an integrated circuit, a method of sensing first and second stored bit signals from a first bitline and from a second bitline for output onto a single-ended output data line, comprising:

precharging first and second bitlines to a predetermined level;

transferring a stored bit signal onto said first bitline;

first applying said first stored bit signal from said first bitline to a control terminal of a first control device coupled to a single-ended output data line to control an output signal level on said single-ended output data line according to a level of said stored bit signal, said first control device being placed in a current path between said single-ended output data line and a fixed potential;

timing said step of first applying with a first read timing signal applied only to a first read timing device placed in a current path between said single-ended data line and a fixed potential;

precharging said first and second bitlines to a predetermined level;

transferring a second stored bit signal onto said second bitline;

second applying said second stored bit signal from said second bitline to a control terminal of a second control device coupled to the single-ended output data line to control an output signal level on said single-ended output data line according to a level of said second stored bit signal, said second control device being placed in a current path between said single-ended output data line and the fixed potential;

timing said step of second applying with a second read timing signal applied only to a first read timing device placed in a current path between said single-ended data line and the fixed potential.

55. The method of claim 54, further comprising aiding signal swing on said single-ended output data line by amplifying a potential difference between said first and said second bitlines.

56. The method of claim 55, wherein said step of amplifying is performed using cross-coupled CMOS device pairs.

57. The method of claim 56, further comprising a switch between said first and second bitlines and said cross-coupled CMOS device pairs.

58. The method of claim 57, further comprising a first equalization switch coupled to said first bitline and a second equalization device coupled to said second bitline.

59. The method of claim 58, wherein said first equalization device remains on when said second bitline is in signal development, and said second equalization device remains on when said first bitline is in signal development.

60. The method of claim 59, wherein said switch remains on during said signal development, and turns off before said CMOS cross coupled pair performs amplifying.

61. The method of claim 60, wherein said first and second bitlines are precharged immediately after the switch is turned off.

62. The method of claim 55, wherein said step of amplifying is performed using cross-coupled CMOS device pairs with 1/2 Vdd precharged voltage for said bitlines.

63. The method of claim 56, wherein said step of amplifying is performed using cross-coupled CMOS device pairs with 1/2 Vdd precharged voltage for said bitlines.

64. The method of claim 56, wherein a switch between said first and second bitlines and said cross-coupled CMOS device pairs independently couples said first and second bitlines to said cross-coupled CMOS device pairs.

65. The method of claim 54, wherein said step of precharging is performed using first and second precharge devices having current paths between the fixed potential and said first and said second bitlines, respectively, and an equalization device having current paths between said first and said second bitlines.

66. The method of claim 54, in a destructive read operation, thus destroying said transferred data.

67. The method of claim 66, wherein said destroyed transferred data are recovered only if said destroyed data are rewritten.

68. The method of claim 67, and allowing a cell to store a bitline voltage transferred from the stored bit signal without amplifying.

69. The method of claim 68, wherein said stored bitline voltage in the cell is used for a precondition write for rewriting said destroyed data.

70. The method of claim 54, wherein said bitlines do not fully swing in a read mode.

71. Within an integrated circuit, a method of sensing a first stored bit on a first bitline and a second stored bit on a second bitline with a CMOS cross-coupled sense node pair, comprising a switch to couple said first bitline and one node of said sense node pair, and to couple said second bitline to the other node of said sense node, a first equalization device coupled to said first bitline and a second equalization device coupled to said second bitline, wherein said first equalization device remains on when said second bitline is in signal development for said first stored bit, and said second equalization device remains on when said first bitline is in signal development for said second stored bit, controlling means to turn on said switch during said signal development, and to turn off said switch before said CMOS cross-coupled sense node pair is amplified.

72. The method of claim 71, wherein said bitlines states are precharged immediately after the switch is turned off.

* * * * *